(12) United States Patent
You et al.

(10) Patent No.: US 8,759,836 B2
(45) Date of Patent: Jun. 24, 2014

(54) THIN FILM TRANSISTOR ARRAY SUBSTRATE, ORGANIC LIGHT-EMITTING DISPLAY DEVICE INCLUDING THE SAME AND METHOD OF MANUFACTURING THE THIN FILM TRANSISTOR ARRAY SUBSTRATE

(75) Inventors: Chun-Gi You, Yongin (KR); Joon-Hoo Choi, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/589,636

(22) Filed: Aug. 20, 2012

(65) Prior Publication Data
US 2013/0200379 A1 Aug. 8, 2013

(30) Foreign Application Priority Data
Feb. 7, 2012 (KR) .................. 10-2012-0012539

(51) Int. Cl.
*H01L 29/04* (2006.01)
*H01L 29/12* (2006.01)
*H01L 29/15* (2006.01)

(52) U.S. Cl.
USPC ................................. 257/72; 257/59; 257/71

(58) Field of Classification Search
USPC .............................................. 257/59, 71, 72
See application file for complete search history.

(56) References Cited

U.S. PATENT DOCUMENTS

2009/0278131 A1 11/2009 Kwon et al.
2013/0037818 A1* 2/2013 Lee et al. ..................... 257/72

FOREIGN PATENT DOCUMENTS

KR 10-2009-0116131 11/2009
KR 10-2009-0120698 A 11/2009

* cited by examiner

*Primary Examiner* — Chuong A Luu
*Assistant Examiner* — Cory Eskridge
(74) *Attorney, Agent, or Firm* — Lee & Morse, P.C.

(57) ABSTRACT

A thin film transistor (TFT) array substrate includes a TFT including an active layer, a gate electrode, source and drain electrodes, a first insulating layer between the active layer and the gate electrode, and a second insulating layer and a third insulating layer between the gate electrode and the source and drain electrodes, the first insulating layer and the second insulating layer extending in the TFT, a pixel electrode including a transparent conductive oxide material, the pixel electrode being on the first insulating layer and the second insulating layer and being connected to the source or drain electrodes via an opening in the third insulating layer, a capacitor including a first electrode on a same layer as the gate electrode and a second electrode on a same layer as the pixel electrode; and a fourth insulating layer covering the source and drain electrodes and exposing the pixel electrode via an opening.

20 Claims, 6 Drawing Sheets

FIG. 3 (Comparative Example)

FIG. 4A  (Comparative Example)

FIG. 4B  (Comparative Example)

FIG. 4C  (Comparative Example)

FIG. 4D (Comparative Example)

FIG. 4E (Comparative Example)

THIN FILM TRANSISTOR ARRAY SUBSTRATE, ORGANIC LIGHT-EMITTING DISPLAY DEVICE INCLUDING THE SAME AND METHOD OF MANUFACTURING THE THIN FILM TRANSISTOR ARRAY SUBSTRATE

CROSS-REFERENCE TO RELATED PATENT APPLICATION

This application claims the benefit of Korean Patent Application No. 10-2012-0012539, filed on Feb. 7, 2012, in the Korean Intellectual Property Office, the disclosure of which is incorporated herein in its entirety by reference.

BACKGROUND

1. Field

Embodiments relate to a thin film transistor (TFT) array substrate, an organic light-emitting display device including the TFT array substrate, and a method of manufacturing the thin film transistor (TFT) array substrate.

2. Description of the Related Art

A flat display device such as an organic light-emitting display device, a liquid crystal display (LCD) device, or the like includes a thin film transistor (TFT), a capacitor, and wiring for connecting the TFT and the capacitor.

Regarding a substrate used in the manufacture of the flat display device, the TFT, the capacitor, and the wiring are formed as minute patterns on the substrate, and in order to form the minute patterns on the substrate, a photolithography process of transferring a pattern by using a mask may be used.

In the photolithography process, photoresist is uniformly coated on a substrate on which a pattern is to be formed, the photoresist is exposed by using an exposing apparatus such as a stepper, and (in a case of positive photoresist) the sensitized photoresist is developed. After the photoresist is developed, the pattern on the substrate is etched by using remaining photoresist, and after the pattern is formed, unnecessary photoresist is removed.

SUMMARY

According to an embodiment, there is provided a thin film transistor (TFT) array substrate including a TFT including an active layer, a gate electrode, source and drain electrodes, a first insulating layer between the active layer and the gate electrode, and a second insulating layer and a third insulating layer that are between the gate electrode and the source and drain electrodes, the first insulating layer and the second insulating layer extending in the TFT, a pixel electrode including a transparent conductive oxide material, the pixel electrode being on the first insulating layer and the second insulating layer and being connected to one of the source and drain electrodes via a hole in the third insulating layer, a capacitor including a first electrode on a same layer as the gate electrode and a second electrode disposed on a same layer as the pixel electrode, and a fourth insulating layer covering the source and drain electrodes, the pixel electrode being exposed via an opening in the third insulating layer and the fourth insulating layer.

The second electrode may be between the second insulating layer and the third insulating layer. A dielectric constant of the second insulating layer may be greater than a dielectric constant of the first insulating layer. The pixel electrode may be between the second insulating layer and the third insulating layer.

The transparent conductive oxide material may include at least one material selected from indium tin oxide (ITO), indium zinc oxide (IZO), zinc oxide (ZnO), indium oxide ($In_2O_3$), indium gallium oxide (IGO), and aluminum zinc oxide (AZO).

The pixel electrode may further include a transflective metal layer. The transflective metal layer may include at least one material selected from silver (Ag), an Ag alloy, aluminum (Al), and an Al alloy.

A transparent conductive oxide layer is further disposed on the transflective metal layer. The third insulating layer and the fourth insulating layer may have a same etching surface at the opening through the third insulating layer and the fourth insulating layer that exposes the pixel electrode.

According to an embodiment, there is provided an organic light-emitting display device including a thin film transistor (TFT) including an active layer, a gate electrode, source and drain electrodes, a first insulating layer between the active layer and the gate electrode, and a second insulating layer and a third insulating layer that are between the gate electrode and the source and drain electrodes, the first insulating layer and the second insulating layer extending in the TFT, a pixel electrode including a transparent conductive oxide material, the pixel electrode being on the first insulating layer and the second insulating layer and connected to one of the source and drain electrodes via an hole formed in the third insulating layer, a capacitor including a first electrode on a same layer as the gate electrode, and a second electrode on a same layer as the pixel electrode, a fourth insulating layer covering the source and drain electrodes and exposing the pixel electrode via an opening, an intermediate layer on the pixel electrode and including an organic emission layer (organic EML), and an opposite electrode on the intermediate layer.

The opposite electrode may be a reflective electrode that reflects light emitted from the organic EML.

The pixel electrode may further include a transflective metal layer. The pixel electrode and the second electrode may be between the second insulating layer and the third insulating layer.

A portion of the intermediate layer may directly contact the third insulating layer.

According to an embodiment, there is provided a method of manufacturing a thin film transistor (TFT) array substrate, the method including a first mask process of forming a semiconductor layer on a substrate and forming an active layer of a TFT by patterning the semiconductor layer, a second mask process of forming a first insulating layer on a resultant structure of the first mask process, forming a first conductive layer on the first insulating layer, and forming a gate electrode and a first electrode of a capacitor by patterning the first conductive layer, a third mask process of forming a second insulating layer and a transparent conductive oxide layer on a resultant structure of the second mask process and forming a pixel electrode and a second electrode of the capacitor by patterning the transparent conductive oxide layer, a fourth mask process of forming a third insulating layer on a resultant structure of the third mask process, forming an opening that exposes source and drain regions of the active layer by patterning the third insulating layer, and removing a portion of the third insulating layer in a region corresponding to the pixel electrode, a fifth mask process of forming a second conductive layer on a resultant structure of the fourth mask process and forming source and drain electrodes that connect the source and drain regions, respectively, by patterning the second conductive layer, and a sixth mask process of forming a fourth insulating layer on a resultant structure of the fifth mask process and removing the fourth insulating layer so as to expose the pixel electrode.

After the second mask process is performed, the source and drain regions may be doped with ion impurities.

In the third mask process, a transflective metal layer and a protective layer for protecting the transflective metal layer may be further formed on the transparent conductive oxide layer.

The fourth mask process may be performed by using a half-tone mask including a light-transflecting portion at a position corresponding to the pixel electrode.

En the fifth mask process, when the second conductive layer in a region corresponding to the pixel electrode is removed, the third insulating layer in the region corresponding to the pixel electrode may not be completely removed, and a remaining portion of the third insulating layer may cover the pixel electrode.

In the sixth mask process, when the fourth insulating layer is removed, the remaining portion of the third insulating layer that remains in the region corresponding to the pixel electrode is also removed.

BRIEF DESCRIPTION OF THE DRAWINGS

The above and other features and advantages will become more apparent by describing in detail exemplary embodiments thereof with reference to the attached drawings in which.

DETAILED DESCRIPTION

Hereinafter, embodiments will be described in detail by explaining exemplary embodiments of the invention with reference to the attached drawings.

As used herein, the term "and/or" includes any and all combinations of one or more of the associated listed items.

Expressions such as "at least one of," when preceding a list of elements, modify the entire list of elements and do not modify the individual elements of the list.

Figure 1:
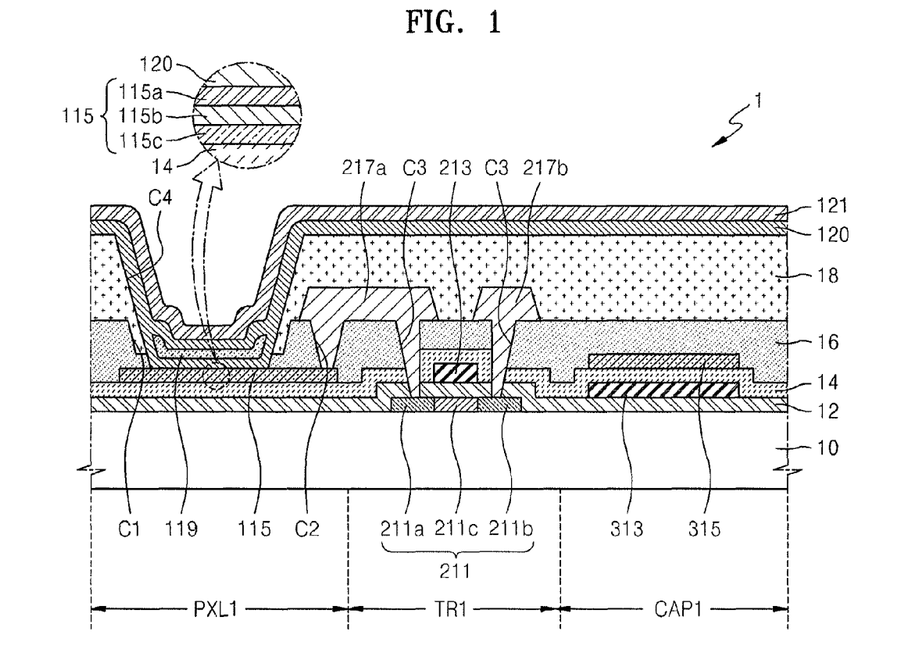
FIG. 1 is a cross-sectional view of an organic light-emitting display device according to an embodiment.

FIG. 1 is a cross-sectional view of an organic light-emitting display device 1 according to an embodiment.

Referring to FIG. 1, a pixel region PXL1, a transistor region TR1, and a capacitor region CAP 1 are arranged on a substrate 10 of the organic light-emitting display device 1.

The substrate 10 may be formed as a transparent substrate such as a glass substrate or a plastic substrate such as polyethylene terephthalate (PET), polyethylene naphthalate (PEN), polyimide, or the like.

An active layer 211 is formed on the substrate 10. The active layer 211 may be formed of a semiconductor including amorphous silicon or polysilicon. The active layer 211 may include a channel region 211c, and a source region 211a and a drain region 211b that are formed in outer regions of the channel region 211c by being doped with ion impurities.

A buffer layer (not shown) may be further formed between the substrate 10 and the active layer 211. The buffer layer (not shown) may function to form a flat surface on the substrate 10 and to prevent penetration of foreign substances. The buffer layer may be formed as a single-layered structure or a multi-layered structure including silicon nitride and/or silicon oxide.

A gate electrode 213 is arranged at a position corresponding to the channel region 211c of the active layer 211 by having a first insulating layer 12 (that is a gate insulating layer) interposed therebetween. The gate electrode 213 may be formed as a single layer or a multi-layer including at least one metal material selected from aluminum (Al), platinum (Pt), palladium (Pd), silver (Ag), magnesium (Mg), gold (Au), nickel (Ni), neodymium (Nd), iridium (Ir), chromium, (Cr), lithium (Li), calcium (Ca), molybdenum (Mo), titanium (Ti), tungsten (W), and copper (Cu).

Figure 3:
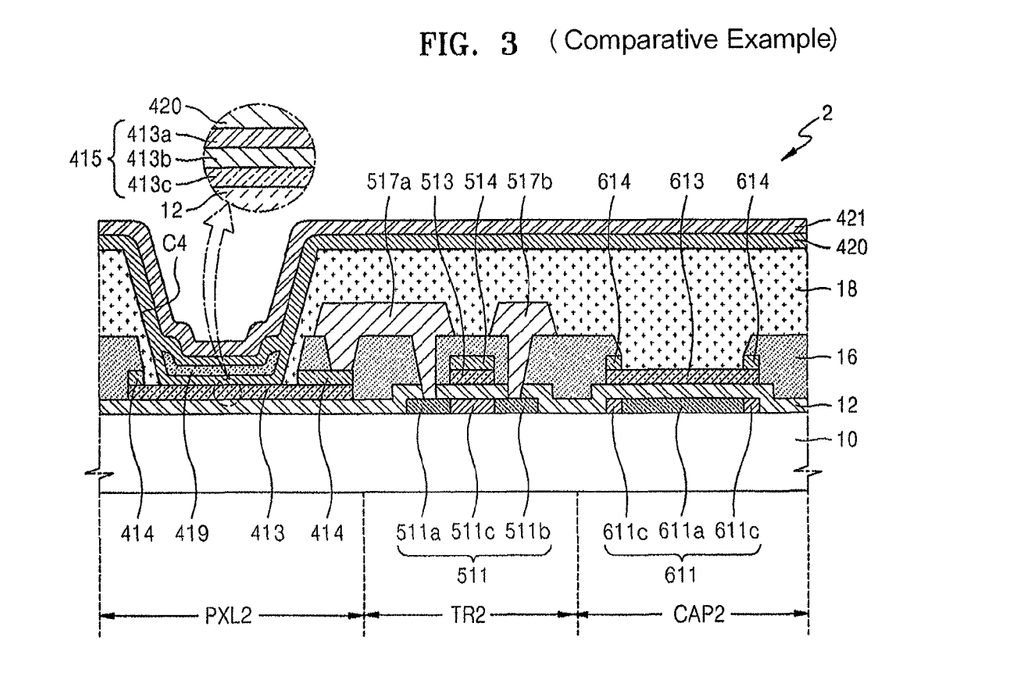
FIG. 3 is a cross-sectional view of an organic light-emitting display device of FIG. 3 according to a comparative example.

Unlike the present embodiment, if a gate electrode were to be formed as a multi-layered structure including a first gate electrode 513 including a transparent conductive oxide material and a second gate electrode 514 including a low-resistance metal material, as in an organic light-emitting display device 2 of FIG. 3 according to a comparative example, when a pattering operation is performed, an undercut may occur between the second gate electrode 514 and the first gate electrode 513 such that a step coverage may deteriorate. In this case, after a third insulating layer 16 that is an interlayer insulating layer is formed, a crack may occur on the third insulating layer 16 when a thermal process is performed.

Also, signal wiring (not shown) such as scan signal wiring formed of the same material as the first and second gate electrodes 513 and 514 may be formed on the first insulating layer 12 of FIG. 3. If the signal wiring (not shown) were also to be formed as a multi-layered structure including a first layer including a transparent conductive oxide material and a second layer including a low-resistance metal material, as in the first and second gate electrodes 513 and 514 depicted in FIG. 3, adhesion between the first layer including the transparent conductive oxide material and the first insulating layer 12 that directly contacts the first layer deteriorates such that the first layer may be lifted.

However, in the organic light-emitting display device 1 according to the present embodiment, the gate electrode 213 and the signal wiring (not shown) may be directly formed on the first insulating layer 12 without using the transparent conductive oxide material. Accordingly, the occurrence of the undercut, and the lifting phenomenon of the signal wiring may be prevented, so that a defect of the organic light-emitting display device 1 may be prevented.

Referring again to FIG. 1, a second insulating layer 14 that is a first interlayer insulating layer and the third insulating layer 16 that is a second interlayer insulating layer are formed on the gate electrode 213.

A source electrode 217a and a drain electrode 217b that are connected to the source region 211a and the drain region 211, respectively, via openings C3 are formed on the third insulating layer 16. A fourth insulating layer 18 is formed on the third insulating layer 16 so as to cover the source electrode 217a and the drain electrode 217b.

One of the source electrode 217a and the drain electrode 217b is connected to a pixel electrode 115 of the pixel region PXL1 via a hole or opening C2. In the present embodiment of FIG. 1, the source electrode 217a is connected to the pixel electrode 115. However, in other implementations, the drain electrode 217b may be connected to the pixel electrode 115.

A TFT of the present embodiment of FIG. 1 may be a driving TFT in which one of the source electrode 217a and the drain electrode 217b is directly connected to the pixel electrode 115, but it is to be understood that the organic light-emitting display device 1 may further include another TFT such as a switching TFT or the like.

In the pixel region PXL1, the pixel electrode 115 that is formed of the same material as a second electrode 315 of a capacitor to be described below is formed between the second insulating layer 14 and the third insulating layer 16.

An intermediate layer 120 including an organic emission layer (organic EML) 119 is formed on the pixel electrode 115, and an opposite electrode 121 is formed as a common electrode on the intermediate layer 120. In the organic light-emitting display device 1 according to the present embodiment, the pixel electrode 115 may be used as an anode and the opposite electrode 121 may be used as a cathode, however, in other implementations, the polarities of the electrodes may be switched.

The organic EML 119 may be formed as a small molecule organic layer or a polymer organic layer. When the organic EML 119 is formed as a small molecule organic layer, the intermediate layer 120 may have a structure in which a hole transport layer (HTL), a hole injection layer (HIL), an electron transport layer (ETL), an electron injection layer (EIL) or the like are stacked. In addition to these layers, various layers may be stacked as desired. The intermediate layer 120 may be formed by using one of various organic materials including copper phthalocyanine (CuPc), N,N-di(naphthalene-1-yl)-N, N'-diphenyl-benzidine (NPB), tris-8-hydroxyquinoline aluminum)(Alq$_3$), or the like. When the organic EML 119 is formed as a polymer organic layer, the intermediate layer 120 may include the HTL. The HTL may include poly-(3,4)-ethylene-dihydroxy thiophene (PEDOT), polyaniline (PANI), or the like. The HTL may be formed of polyphenylene vinylene (PPV)-based polymer organic materials or polyfluorene-based polymer organic materials.

Light from the organic EML 119 may be emitted toward the substrate 10 or may be emitted away from the substrate 10. When the opposite electrode 121 is formed as the common electrode, the amplitude of current that is applied to each pixel may vary due to a voltage drop of the opposite electrode 121. In particular, as a size of a display device is increased, the voltage drop is also increased so that it is desirable to decrease the resistance of the opposite electrode 121.

In order to decrease the resistance of the opposite electrode 121, the opposite electrode 121 may be formed of a low-resistance material or a thickness of the opposite electrode 121 may be increased. In the present embodiment, the opposite electrode 121 is formed of a low-resistance material selected from Al, Mg, Li, Ca, LiF/Ca, and LiF/Al and has a predetermined thickness. In this case, the opposite electrode 121 may function as a reflective electrode.

When the pixel electrode 115 includes a transparent conductive oxide material and the opposite electrode 121 is formed as the reflective electrode, light from the organic EML 119 is emitted toward the substrate 10.

Because a luminescent efficiency is an issue in an organic light-emitting display device 1, as in the present embodiment, the pixel electrode 115 may be formed as a transflective electrode that includes a first layer 115a including a transparent conductive oxide material, a transflective metal layer 115b, and a second layer 115c including a transparent conductive oxide material. The pixel electrode 115 and the opposite electrode 121 may function as a transflective mirror and a reflective mirror, respectively, so that the light from the organic EML 119 resonates between the opposite electrode 121 and the transflective metal layer 115b.

Here, the first layer 115a and the second layer 115c that include the transparent conductive oxide material may include at least one material selected from indium tin oxide (ITO), indium zinc oxide (IZO), zinc oxide (ZnO), indium oxide (In$_2$O$_3$), indium gallium oxide (IGO), and aluminum zinc oxide (AZO). The first layer 115a, which is formed between the second insulating layer 14 and the transflective metal layer 115b, may decrease an adhesion stress between the second insulating layer 14 and the transflective metal layer 115b. The second layer 115c, which is formed between the intermediate layer 120 and the transflective metal layer 115b, may decrease a work function difference between the transflective metal layer 115b and the intermediate layer 120.

The transflective metal layer 115b may be formed of at least one material selected from Ag, an Ag alloy, Al, and an Al alloy. In order to function as a resonance mirror with respect to the opposite electrode 121, which is the reflective electrode, the transflective metal layer 115b may have a thickness equal to or less than 300 Å.

In particular, when the transflective metal layer 115b includes Ag, the source electrode 217a and the drain electrode 217b may be formed after the transflective metal layer 115b is formed. To avoid a risk of damage to the transflective metal layer 115b including Ag when the source electrode 217a and the drain electrode 217b are etched the pixel electrode 115 including the transflective metal layer 115b may be covered by the third insulating layer 16 and thus may be protected while the source electrode 217a and the drain electrode 217b are etched. Then, after the source electrode 217a and the drain electrode 217b are etched, the third insulating layer 16 is removed together with the fourth insulating layer 18, so that a damage of the pixel electrode 115 including the transflective metal layer 115b may be prevented.

A portion of an opening C1 of the third insulating layer 16 and a portion of an opening C4 of the fourth insulating layer 18 that are formed in an outer region of the pixel electrode 115 and expose the pixel electrode 115 may have the same etching surface.

As described above, in the organic light-emitting display device 1 according to the present embodiment, a stable resonance structure is formed by preventing the damage of the pixel electrode 115 including the transflective metal layer 115b, so that a luminescent efficiency may be improved.

In the capacitor region CAP1, a first electrode 313 of the capacitor is formed on the first insulating layer 12. The first electrode 313 is formed of the same material as the gate electrode 213 of the TFT.

The second electrode 315 is formed on the first electrode 313. The second electrode 315 is formed of the same material as the pixel electrode 115. In more detail, the second electrode 315 may be formed of the same transparent conductive oxide material as the pixel electrode 115.

The second insulating layer 14, which is a dielectric layer, is formed between the first electrode 313 and the second electrode 315. The first insulating layer 12, which functions as the gate insulating layer of the TFT, is not used as the dielectric layer but instead, the second insulating layer 14, separately from the first insulating layer 12, is used as the dielectric layer of the capacitor. Accordingly, the first insulating layer 12 may be formed to satisfy characteristics of the gate insulating layer, and the second insulating layer 14 may be formed to satisfy characteristics of the dielectric layer.

In the present embodiment, the second insulating layer 14, which is used as the dielectric layer, may be formed of an insulating material having a dielectric constant greater than a dielectric constant of the first insulating layer 12. The second insulating layer 14 is separately formed from the first insulating layer 12 that functions as the gate insulating layer. Accordingly, when the second insulating layer 14 is formed of the insulating material having the dielectric constant greater than the dielectric constant of the first insulating layer 12, the capacitance may be increased without increasing an area of the capacitor. Accordingly, an area of the pixel electrode 115 may be relatively increased, so that an aperture ratio of the organic light-emitting display device 1 may be increased.

Hereinafter, a method of manufacturing the organic light-emitting display device 1 according to an embodiment will be described with reference to FIGS. 2A through 2F.

Figure 2A:
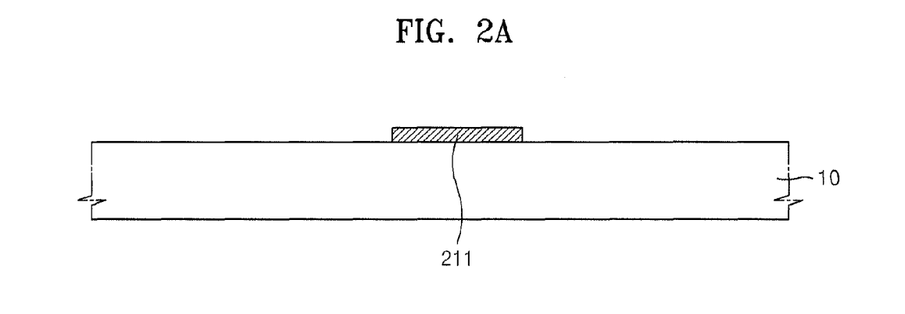
FIG. 2A is a cross-sectional view schematically illustrating a result of a first mask process with respect to the organic light-emitting display device.

FIG. 2A is a cross-sectional view schematically illustrating a result of a first mask process with respect to the organic light-emitting display device 1.

Referring to FIG. 2A, a semiconductor layer (not shown) is formed on a substrate 10, and an active layer 211 of a TFT is formed by patterning the semiconductor layer (not shown).

Although not illustrated in FIG. 2A, the semiconductor layer (not shown) is deposited on the substrate 10, a photoresist (not shown) is coated on the semiconductor layer (not shown), and then the semiconductor layer (not shown) is patterned by a photolithography process using a first photomask (not shown). As a result of the patterning operation, the active layer 211 is formed. The first mask process using the photolithography process is performed in a manner such that the first photomask (not shown) is exposed by using an exposing apparatus (not shown), and then a developing operation, an etching operation, a stripping or ashing operation are performed thereon.

The semiconductor layer (not shown) may be formed as an amorphous silicon layer or a polysilicon layer. The polysilicon layer may be formed by crystallizing amorphous silicon. The crystallization of the amorphous silicon may be performed by using various methods such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or the like.

Figure 2B:
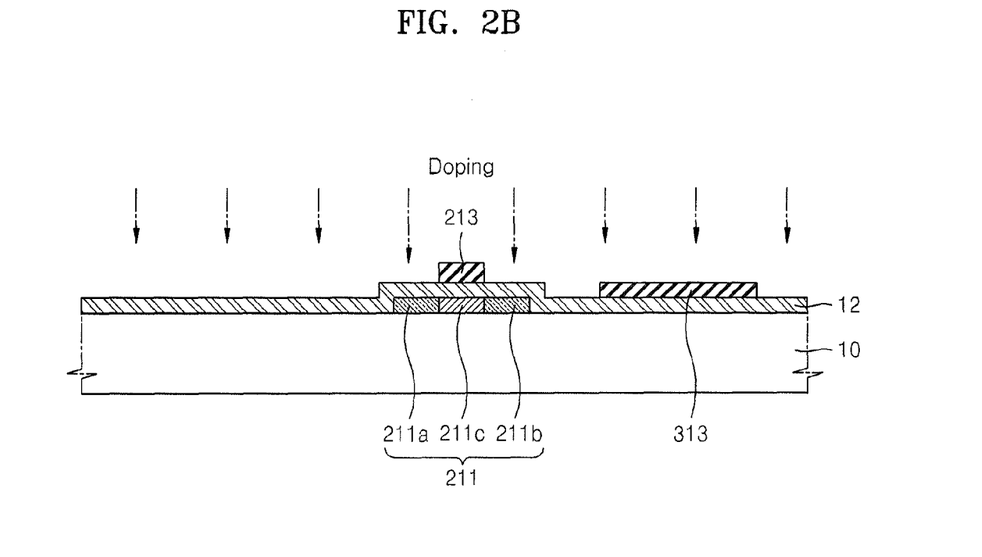
FIG. 2B is a cross-sectional view schematically illustrating a result of a second mask process with respect to the organic light-emitting display device.

FIG. 2B is a cross-sectional view schematically illustrating a result of a second mask process with respect to the organic light-emitting display device 1.

Referring to FIG. 2B, a first insulating layer 12 and a first conductive layer (not shown) are sequentially stacked on a resultant structure of the first mask process of FIG. 2A, and then the first conductive layer (not shown) is patterned.

The first insulating layer 12 may be formed as an inorganic insulating layer including a material selected from $SiO_2$, $SiN_x$, $SiON$, $Al_2O_3$, $TiO_2$, $Ta_2O_5$, $HfO_2$, $ZrO_2$, BST and PZT.

The first conductive layer (not shown) may be formed as a single layer or a multi-layer including at least one metal material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

As a result of the patterning operation, a gate electrode 213 and a first electrode 313 of a capacitor are formed on the first insulating layer 12. The first insulating layer 12 functions as a gate insulating layer of the TFT but does not function as a dielectric layer of the capacitor. Thus, it is possible to select a material and a thickness of the first insulating layer 12, in consideration only of characteristics of the TFT without consideration of characteristics of the capacitor.

In the present embodiment, the gate electrode 213 may be formed as a layer that includes only a low-resistance metal material and does not include a transparent conductive oxide material. Accordingly, an occurrence of an undercut may be prevented when the gate electrode 213 is patterned. Also, signal wiring (not shown) such as scan signal wiring formed of the same material as the gate electrode 213 may be directly formed on the first insulating layer 12. Accordingly, a lifting phenomenon of the signal wiring due to the patterning operation may be prevented.

After the second mask process, ion impurities are doped on the active layer 211. The ion impurities may include B ions or P ions, and the doping may be performed by targeting the active layer 211 at a density equal to or greater than $1 \times 10^{15}$ atoms/cm$^2$. The active layer 211 is doped with the ion impurities by using the gate electrode 213 as a self-alignment mask, so that the active layer 211 has a source region 211a and a drain region 211b that are doped with the ion impurities, and a channel region 211c is formed therebetween.

Although not illustrated in detail in FIG. 2B, during the second mask process, wiring such as a scan line that is connected to the gate electrode 213 may also be formed by patterning the first conductive layer (not shown).

Figure 2C:
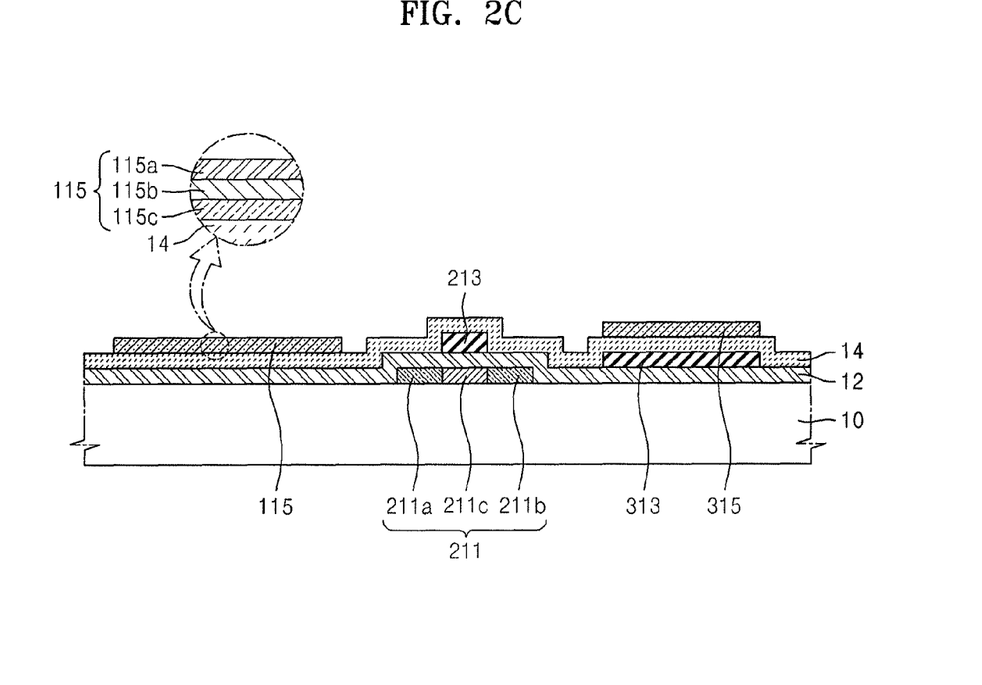
FIG. 2C is a cross-sectional view schematically illustrating a result of a third mask process with respect to the organic light-emitting display device.

FIG. 2C is a cross-sectional view schematically illustrating a result of a third mask process with respect to the organic light-emitting display device 1.

Referring to FIG. 2C, a second insulating layer 14 and a transparent conductive oxide layer (not shown) are formed on a resultant structure of the second mask process of FIG. 2B, and then the transparent conductive oxide layer (not shown) is patterned.

As a result of the patterning operation, a pixel electrode 115 and a second electrode 315 of the capacitor are formed. The pixel electrode 115 may be formed as a transflective electrode that includes a first layer 115a including a transparent conductive oxide material, a transflective metal layer 115b, and a second layer 115c including a transparent conductive oxide material.

The second insulating layer 14 may be formed as an inorganic insulating layer including a material selected from $SiO_2$, $SiN_x$, $SiON$, $Al_2O_3$, $TiO_2$, $Ta_2O_5$, $HfO_2$, $ZrO_2$, BST and PZT. As described above, the second insulating layer 14 is not used as a gate insulating layer but is only used as a dielectric layer. Accordingly, the second insulating layer 14 may be formed of a material having a high dielectric constant, compared to the first insulating layer 12 that is used as the gate insulating layer.

Figure 2D:
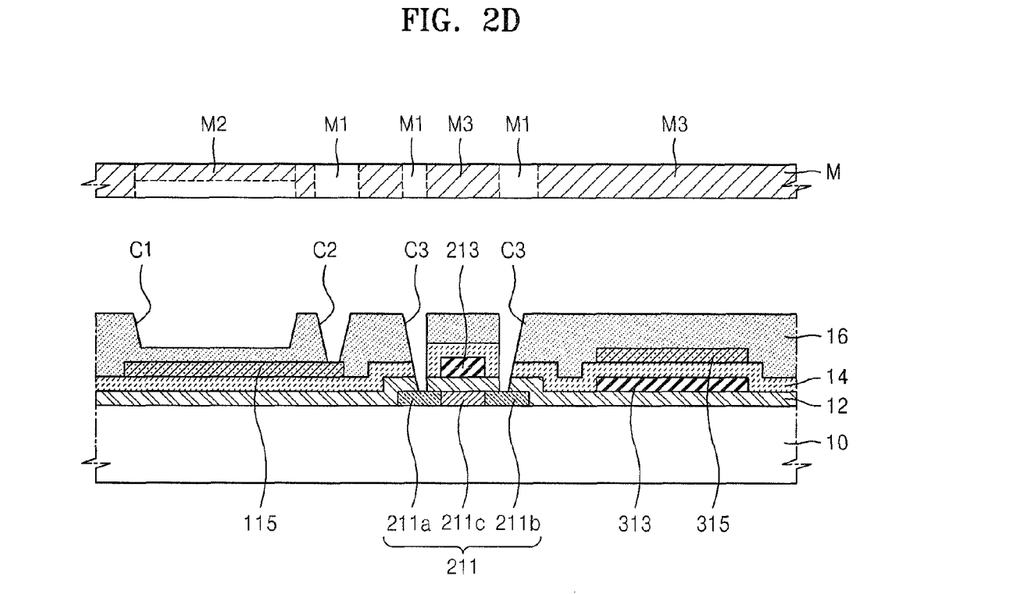
FIG. 2D is a cross-sectional view schematically illustrating a result of a fourth mask process with respect to the organic light-emitting display device.

FIG. 2D is a cross-sectional view schematically illustrating a result of a fourth mask process with respect to the organic light-emitting display device 1.

Referring to FIG. 2D, a third insulating layer 16 is formed on a resultant structure of the third mask process of FIG. 2C and then is patterned to form an opening C1 that removes a portion of a thickness of the third insulating layer 16 on the pixel electrode 115, an opening C2 that connects the pixel electrode 115 and one of a source electrode 217a and a drain electrode 217b, and openings C3 that expose portions of a source region 211a and a drain region 211b of the active layer 211.

The openings C1 through C3 are formed by using a halftone mask M including light-transmitting portions M1, a light-transflecting portion M2, and light-blocking portions M3. In more detail, the opening C2 that connects the pixel electrode 115 and one of the source electrode 217a and the drain electrode 217b, and the openings C3 that expose the portions of the source region 211a and the drain region 211b of the active layer 211 are formed in regions that correspond to the light-transmitting portions M1, and the opening C1 that removes the portion of the thickness of the third insulating layer 16 on the pixel electrode 115 is formed on a region that corresponds to the light-transflecting portion M2. Accordingly, the pixel electrode 115 is not completely exposed but a portion of the thickness of the third insulating layer 16 is removed on the pixel electrode 115. By removing only a portion of the thickness of the third insulating layer 16, damage to the pixel electrode 115 may be prevented.

Figure 2E:
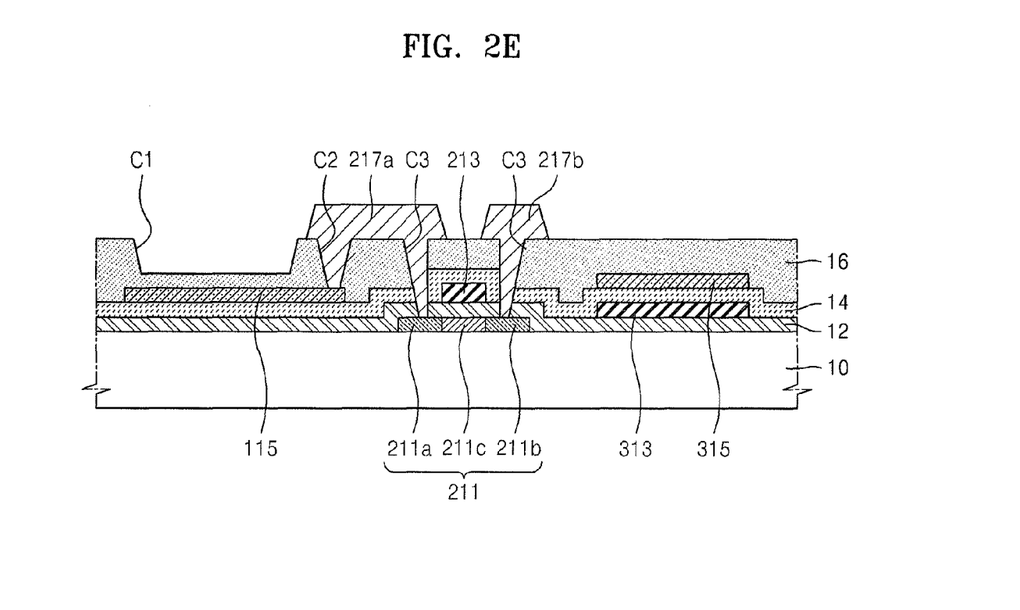
FIG. 2E is a cross-sectional view schematically illustrating a result of a fifth mask process with respect to the organic light-emitting display device.

FIG. 2E is a cross-sectional view schematically illustrating a result of a fifth mask process with respect to the organic light-emitting display device 1.

Referring to FIG. 2E, a second conductive layer (not shown) is formed on a resultant structure of the fourth mask process of FIG. 2D, and as a result of the patterning operation, the source electrode 217a and the drain electrode 217b are formed.

The second conductive layer (not shown) may be formed as a single layer or a multi-layer including at least one metal material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

One of the source electrode 217a and the drain electrode 217b is electrically connected to the pixel electrode 115 via the opening C2. The source electrode 217a and the drain electrode 217b are patterned after the pixel electrode 115 is formed, so that a connection portion of the source electrode 217a or the drain electrode 217b is formed on the pixel electrode 115.

While the source electrode 217a and the drain electrode 217b are etched in the fifth mask process, the pixel electrode 115 is protected by the third insulating layer 16 that covers the pixel electrode 115, so that damage to the pixel electrode 115 may be prevented.

Figure 2F:
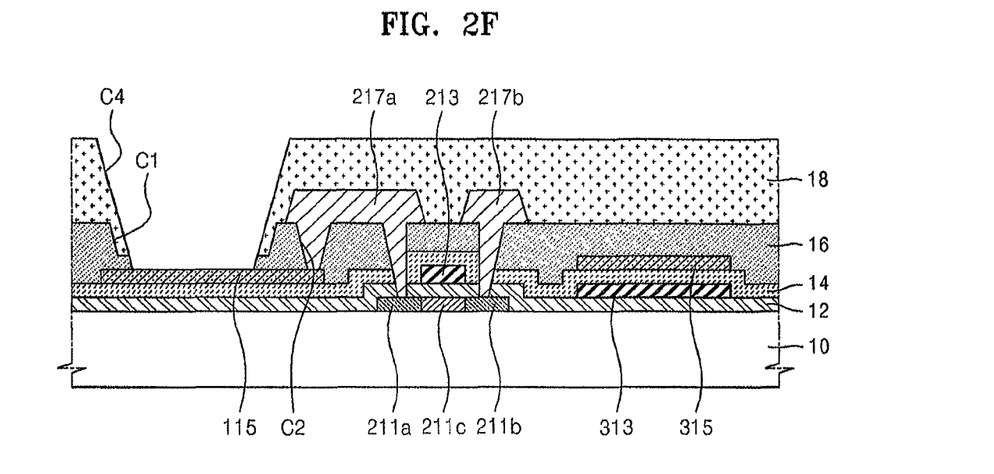
FIG. 2F is a cross-sectional view schematically illustrating a result of a sixth mask process with respect to the organic light-emitting display device.

FIG. 2F is a cross-sectional view schematically illustrating a result of a sixth mask process with respect to the organic light-emitting display device 1.

Referring to FIG. 2F, a fourth insulating layer 18 is formed on a resultant structure of the fifth mask process of FIG. 2E, and then an opening C4 that exposes a top surface of the pixel electrode 115 is formed.

The fourth insulating layer 18 may be formed as a single-layered structure including an organic insulating layer or may be formed as a multi-layered structure including an inorganic insulating layer and an organic insulating layer. The fourth insulating layer 18 may include polymer derivatives including commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

In the sixth mask process in which the fourth insulating layer 18 is removed to expose the top surface of the pixel electrode 115, the third insulating layer 16 that had remained in a region corresponding to the pixel electrode 115 is also removed by using the same photomask. Thus, a portion of the opening C1 of the third insulating layer 16 and a portion of the opening C4 of the fourth insulating layer 18 that are formed in an outer region of the pixel electrode 115 and expose the pixel electrode 115 may have the same etching surface.

As described above, according to the method of manufacturing the organic light-emitting display device 1, the third insulating layer 16 that protects the pixel electrode 115 is removed in a last mask process, so that damage to the pixel electrode 115 may be prevented while the source electrode 217a and the drain electrode 217b are etched. Thus, by forming a stable resonance structure, a luminescent efficiency may be improved.

FIG. 3 is a cross-sectional view of the organic light-emitting display device 2 of FIG. 3 according to the comparative example.

Referring to FIG. 3, the organic light-emitting display device 2 of FIG. 3 according to the comparative example includes a pixel region PXL2, a transistor region TR2, and a capacitor region CAP2.

In the transistor region TR2, a gate electrode includes a first layer 513 including a transparent conductive oxide material and a second layer 514 including a low-resistance metal material, so that, when a pattering operation is performed, an undercut may occur between the first layer 513 and the second layer 514, and thus, a step coverage may deteriorate. As a result, after a third insulating layer 16 that is an interlayer insulating layer is formed, a crack may occur on the third insulating layer 16 when a thermal process is performed.

Also, in a case where signal wiring (not shown) is formed on a first insulating layer 12 by using the same material as the gate electrode including the first layer 513 and the second layer 514, adhesion between the first layer 513 including the transparent conductive oxide material and the first insulating layer 12 may deteriorate such that the first layer 513 may be lifted.

In the pixel region PXL2, a pixel electrode including a first layer 413 and a second layer 414 is formed by using the same material on the same layer as the gate electrode including the first layer 513 and the second layer 514.

In the comparative example, an etching surface of the third insulating layer 16 that covers an outer surface of the pixel electrode including the first layer 413 and the second layer 414, and an etching surface of a fourth insulating layer 18 are completely separated. That is, when the third insulating layer 16 is patterned, the pixel electrodes 413 and 414 are completely exposed, such that the second layer 414 of the pixel electrode is also etched when a source electrode 517a and a drain electrode 517b are etched. Thus, the pixel electrode including the first layer 413 and the second layer 414 is not protected until a last process is performed. Further, if the first layer 413 of the pixel electrode is formed as a transflective electrode having a first layer 413a including a transparent conductive oxide material, a transflective metal layer 413b, and a second layer 413c including a transparent conductive oxide material, damage to the pixel electrode may occur.

In the capacitor region CAP2, the third insulating layer 16 is formed to cover outer surfaces of second electrodes 613 and 614, and a region that is not doped with ion impurities is formed in an outer region 611c of a first electrode 611, such that resistance of the capacitor is increased, and a quality of signal transmission deteriorates.

FIGS. 4A through 4E are cross-sectional views schematically illustrating stages of a method of manufacturing the organic light-emitting display device 2 according to the comparative example in FIG. 3.

Figure 4A:
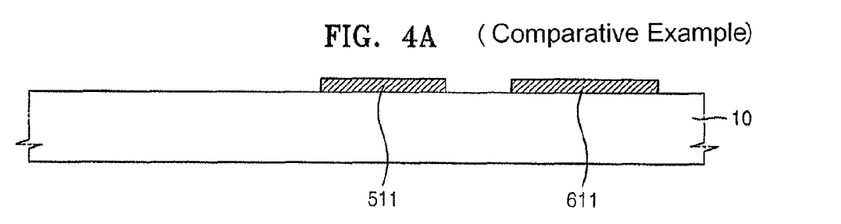
FIGS. 4A through 4E are cross-sectional views schematically illustrating stages of a method of manufacturing the organic light-emitting display device according to the comparative example in FIG. 3.

Referring to FIG. 4A, an active layer 511 that is not doped with ion impurities, and the first electrode 611 of a capacitor that is not doped with ion impurities are formed on a substrate 10.

Figure 4B:
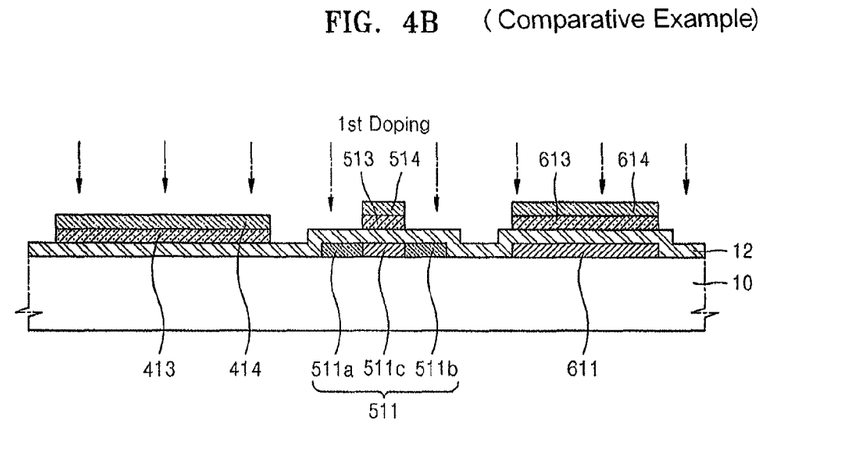

Referring to FIG. 4B, by sequentially stacking and patterning a transparent conductive oxide layer (not shown) and a low-resistance metal layer (not shown), the pixel electrode including the first layer 413 and the second layer 414, the gate electrode including the first layer 513 and the second layer 514, and the second electrodes 613 and 614 of the capacitor are formed, and then first doping is performed.

As a result thereof, the active layer 511 includes source and drain regions 511a and 511b, and a channel region 511c that are doped with ion impurities. Because the second electrodes 613 and 614 function as a blocking mask, the first electrode 611 that is blocked by the second electrodes 613 and 614 is not doped.

When the gate electrode including the first layer 513 and the second layer 514 is patterned, an undercut may occur between the first layer 513 including a transparent conductive oxide material and the second layer 514 including a low-resistance metal material, so that a step coverage may deteriorate. Also, when signal wiring (not shown) is formed of the same material as the gate electrode including the first layer 513 and the second layer 514, adhesion between the first layer 513 and the first insulating layer 12 may deteriorate such that the first layer 513 may be lifted.

The first layer 413 of the pixel electrode may be formed as the transflective electrode having the first layer 413a including a transparent conductive oxide material, the transflective metal layer 413b, and the second layer 413c including a transparent conductive oxide material.

Figure 4C:
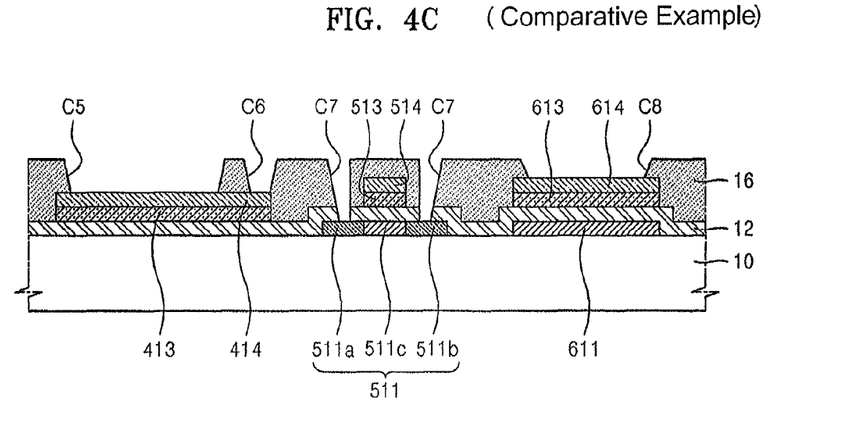

Referring to FIG. 4C, the third insulating layer 16 is formed, and then an opening C5 that exposes the pixel electrode including the first layer 413 and the second layer 414, an opening C6 that connects the pixel electrode including the first layer 413 and the second layer 414 with one of the source electrode 517a and the drain electrode 517b, openings C7 that expose portions of the source and drain regions 511a and 511b of the active layer 511, and an opening C8 that exposes the second electrodes 613 and 614 are formed. Here, the third insulating layer 16 forms the opening C8 by slightly cladding edges of the second electrode 614, without completely exposing the second electrodes 613 and 614.

Figure 4D:
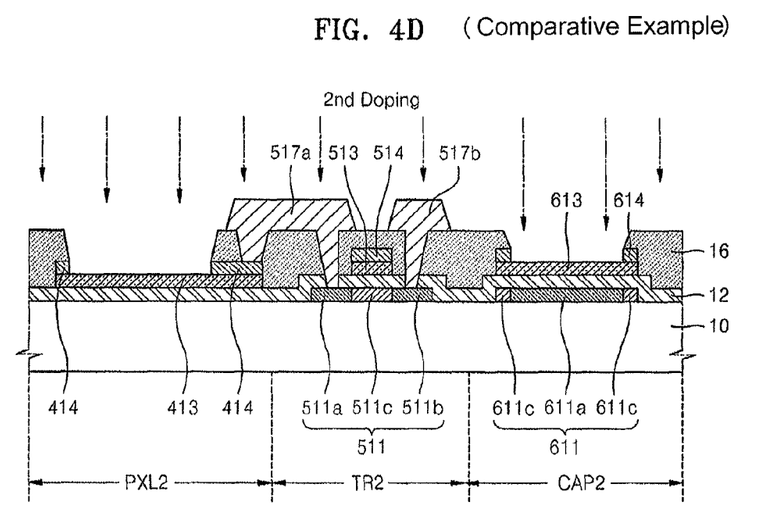

Referring to FIG. 4D, after a second conductive layer (not shown) is stacked on a resultant structure of a third mask process of FIG. 4C while the second conductive layer (not shown) fills the openings C5 through C8, the source electrode 517a and the drain electrode 517b are formed by patterning the second conductive layer (not shown). Here, the second layer 414 of the pixel electrode is removed together with the second electrode 614. Thus, the pixel electrode including the first layer 413 and the second layer 414 are not protected until the last process is performed. Further, if the first layer 413 of the pixel electrode is formed as the transflective electrode having the first layer 413a including a transparent conductive oxide material, the transflective metal layer 413b, and the second layer 413c including a transparent conductive oxide material, damage to the pixel electrode may occur.

Because the third insulating layer 16 covers the edges of the second electrode 614, the second electrode 614 covered with the third insulating layer 16 remains. Afterward, second doping is performed. After the second doping, a center portion 611a of the first electrode 611 is doped but edges of the first electrode 611, which correspond to the remaining edges of the second electrode 614, are not doped. Thus, resistance of the capacitor is increased, and a signal quality deteriorates.

Figure 4E:
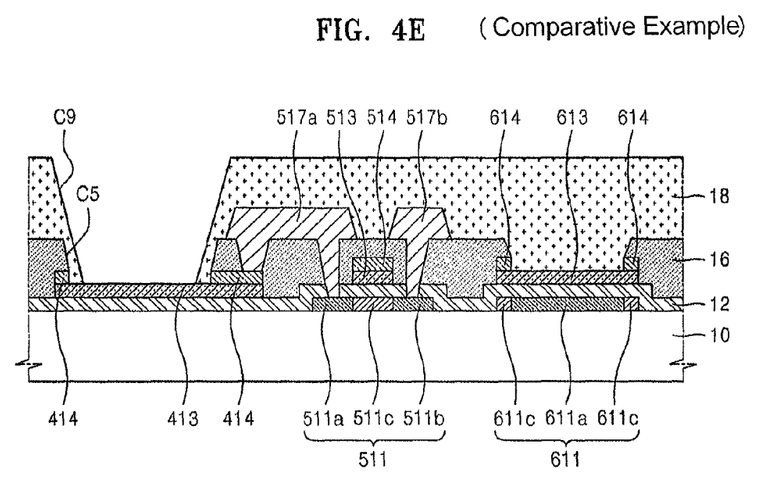

Referring to FIG. 4E, after a fourth insulating layer 18 is stacked on a resultant structure of a fourth mask process, an opening C9 that exposes a top surface of the first layer 413 of the pixel electrode is formed by patterning the fourth insulating layer 18.

In the comparative example, the pixel electrode including the first layer 413 and the second layer 414 is not protected until the last process is performed such that a display quality deteriorates, and undoped regions exist in the edges of the second electrode 614 such that resistance of the capacitor is increased.

According to the one or more embodiments with respect to the TFT array substrate, the organic light-emitting display device 1 including the TFT array substrate, and the method of manufacturing the organic light-emitting display device 1, effects as below may be achieved.

A damage of the pixel electrode 115 including the transflective metal layer 115b may be prevented, so that an efficient resonance structure may be formed.

A gate insulating layer and a dielectric insulating layer may be formed as separate insulating layers, so that it is possible to design insulating layers that satisfy device characteristics of the TFT and the capacitor, respectively.

An undercut in the gate electrode and a lifting phenomenon in the scan signal wiring may be prevented.

The organic light-emitting display device 1 may be manufactured by performing the six mask processes.

Accordingly, the embodiments may provide a thin film transistor (TFT) array substrate that is simply manufactured and has an excellent device characteristic and an excellent luminescent efficiency, an organic light-emitting display device including the TFT array substrate, and a method of manufacturing the organic light-emitting display device While embodiments have been particularly shown and described with reference to exemplary embodiments thereof, it will be understood by those of ordinary skill in the art that various changes in form and details may be made therein without departing from the spirit and scope as defined by the following claims.

What is claimed is:

1. A thin film transistor (TFT) array substrate, comprising:
   a TFT including an active layer, a gate electrode, source and drain electrodes, a first insulating layer between the active layer and the gate electrode, and a second insulating layer and a third insulating layer that are between the gate electrode and the source and drain electrodes, the first insulating layer and the second insulating layer extending in the TFT;
   a pixel electrode including a transparent conductive oxide material, the pixel electrode being on the first insulating layer and the second insulating layer and being connected to one of the source and drain electrodes via a hole in the third insulating layer;
   a capacitor including a first electrode on a same layer as the gate electrode and a second electrode disposed on a same layer as the pixel electrode; and
   a fourth insulating layer covering the source and drain electrodes, the pixel electrode being exposed via an opening.

2. The TFT of claim 1, wherein the second electrode is between the second insulating layer and the third insulating layer.

3. The TFT of claim 1, wherein a dielectric constant of the second insulating layer is greater than a dielectric constant of the first insulating layer.

4. The TFT of claim 1, wherein the pixel electrode is between the second insulating layer and the third insulating layer.

5. The TFT of claim 1, wherein the transparent conductive oxide material includes at least one material selected from indium tin oxide, indium zinc oxide, zinc oxide, indium oxide, indium gallium oxide, and aluminum zinc oxide.

6. The TFT of claim 1, wherein the pixel electrode further includes a transflective metal layer.

7. The TFT of claim 6, wherein the transflective metal layer includes at least one material selected from silver, a silver alloy, aluminum, and an aluminum alloy.

8. The TFT of claim 7, wherein a transparent conductive oxide layer is further disposed on the transflective metal layer.

9. The TFT of claim 1, wherein the third insulating layer and the fourth insulating layer have a same etching surface at the opening that exposes the pixel electrode, the opening extending through the third insulating layer and the fourth insulating layer.

10. An organic light-emitting display device, comprising:
a thin film transistor (TFT) including an active layer, a gate electrode, source and drain electrodes, a first insulating layer between the active layer and the gate electrode, and a second insulating layer and a third insulating layer that are between the gate electrode and the source and drain electrodes, the first insulating layer and the second insulating layer extending in the TFT;
a pixel electrode including a transparent conductive oxide material, the pixel electrode being on the first insulating layer and the second insulating layer and connected to one of the source and drain electrodes via a hole formed in the third insulating layer;
a capacitor including a first electrode on a same layer as the gate electrode, and a second electrode on a same layer as the pixel electrode;
a fourth insulating layer covering the source and drain electrodes and exposing the pixel electrode via an opening;
an intermediate layer on the pixel electrode and including an organic emission layer (organic EML); and
an opposite electrode on the intermediate layer.

11. The organic light-emitting display device of claim 10, wherein the opposite electrode is a reflective electrode that reflects light emitted from the organic EML.

12. The organic light-emitting display device of claim 10, wherein the pixel electrode further includes a transflective metal layer.

13. The organic light-emitting display device of claim 10, wherein the pixel electrode and the second electrode are between the second insulating layer and the third insulating layer.

14. The organic light-emitting display device of claim 10, wherein a portion of the intermediate layer directly contacts the third insulating layer.

15. A method of manufacturing a thin film transistor (TFT) array substrate, the method comprising:
a first mask process of forming a semiconductor layer on a substrate and forming an active layer of a TFT by patterning the semiconductor layer;
a second mask process of forming a first insulating layer on a resultant structure of the first mask process, the first insulating layer extending in the TFT, forming a first conductive layer on the first insulating layer, and forming a gate electrode and a first electrode of a capacitor by patterning the first conductive layer;
a third mask process of forming a second insulating layer and a transparent conductive oxide layer on a resultant structure of the second mask process, the second insulating layer extending in the TFT, and forming a pixel electrode and a second electrode of the capacitor by patterning the transparent conductive oxide layer;
a fourth mask process of forming a third insulating layer on a resultant structure of the third mask process, forming an opening that exposes source and drain regions of the active layer by patterning the third insulating layer, and removing a portion of the third insulating layer to form a hole in the third insulating layer in a region corresponding to the pixel electrode;
a fifth mask process of forming a second conductive layer on a resultant structure of the fourth mask process and forming source and drain electrodes that are connected to the source and drain regions, respectively, connecting one of the source and drain electrodes to the pixel electrode via the hole in the third insulating layer, by patterning the second conductive layer; and
a sixth mask process of forming a fourth insulating layer on a resultant structure of the fifth mask process and removing the fourth insulating layer so as to expose the pixel electrode,
the TFT array substrate formed thereby including:
a TFT including an active layer, a gate electrode, source and drain electrodes, a first insulating layer between the active layer and the gate electrode, and a second insulating layer and a third insulating layer that are between the gate electrode and the source and drain electrodes, the first insulating layer and the second insulating layer extending in the TFT;
a pixel electrode including a transparent conductive oxide material, the pixel electrode being on the first insulating layer and the second insulating layer and being connected to one of the source and drain electrodes via a hole in the third insulating layer;
a capacitor including a first electrode on a same layer as the gate electrode and a second electrode disposed on a same layer as the pixel electrode; and
a fourth insulating layer covering the source and drain electrodes, the pixel electrode being exposed via an opening.

16. The method of claim 15, wherein, after the second mask process is performed, the source and drain regions are doped with ion impurities.

17. The method of claim 15, wherein, in the third mask process, a transflective metal layer and a protective layer for protecting the transflective metal layer are further formed on the transparent conductive oxide layer.

18. The method of claim 15, wherein the fourth mask process is performed by using a half-tone mask including a light-transflecting portion at a position corresponding to the pixel electrode.

19. The method of claim 15, wherein, in the fifth mask process, when the second conductive layer in the region corresponding to the pixel electrode is removed, the third insulating layer in the region corresponding to the pixel electrode is not completely removed, such that a remaining portion of the third insulating layer covers the pixel electrode.

20. The method of claim 15, wherein, in the sixth mask process, when the fourth insulating layer is removed, the remaining portion of the third insulating layer that remains in the region corresponding to the pixel electrode is also removed.

* * * * *